(12) United States Patent
Funatsuki (10) Patent No.: US 10,553,276 B2
(45) Date of Patent: Feb. 4, 2020

(54) SEMICONDUCTOR MEMORY DEVICE

(71) Applicant: Toshiba Memory Corporation, Tokyo (JP)

(72) Inventor: Rieko Funatsuki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 12 days.

(21) Appl. No.: 15/905,350

(22) Filed: Feb. 26, 2018

(65) Prior Publication Data

US 2019/0066782 A1 Feb. 28, 2019

(30) Foreign Application Priority Data

Aug. 29, 2017 (JP) .................. 2017-164770

(51) Int. Cl.
*G06F 3/06* (2006.01)
*G11C 13/00* (2006.01)

(52) U.S. Cl.
CPC ........ *G11C 13/0035* (2013.01); *G06F 3/0619* (2013.01); *G06F 3/0638* (2013.01); *G06F 3/0679* (2013.01); *G11C 13/004* (2013.01); *G11C 13/0023* (2013.01); *G11C 13/0069* (2013.01)

(58) Field of Classification Search
CPC .................. G11C 13/0035; G11C 13/0069
See application file for complete search history.

(56) References Cited

U.S. PATENT DOCUMENTS

| 9,058,884 B2 | 6/2015 | Ueda |
| 9,552,244 B2 | 1/2017 | Kim et al. |
| 2008/0288712 A1 | 11/2008 | Cornwell et al. |
| 2010/0106893 A1* | 4/2010 | Fasoli ............ G11C 16/102 711/103 |
| 2016/0011937 A1 | 1/2016 | Miyamoto et al. |
| 2016/0378582 A1 | 12/2016 | Choi et al. |
| 2018/0136840 A1* | 5/2018 | Ouyang ............ G06F 3/061 |

FOREIGN PATENT DOCUMENTS

| JP | 2013182505 A | 9/2013 |
| JP | 2016018473 A | 2/2016 |

OTHER PUBLICATIONS

Lam, Chung H., "Storage Class Memory", IBM Research, 2010 (Year: 2010).*
Sills, Scott, "High-density ReRAM for Storage Class Memory", Non-volatile Memory Technology Symposium, 2015 (Year: 2015).*

* cited by examiner

*Primary Examiner* — Edward J Dudek, Jr.
(74) *Attorney, Agent, or Firm* — Kim & Stewart LLP (57) ABSTRACT

A semiconductor memory device includes a memory cell array, a first data latch that retains a write unit of data to be written to the memory cell array, a first address latch that retains a write address indicating a write target destination for the write unit of data in the first data latch, a second data latch that retains fail data that is a write unit of data that has failed to be written to the memory cell array, and a second address latch that retains a fail address indicating a write target destination for the fail data. A controller is configured to output the fail address from the second address latch in response to a first output command requesting output of the fail address and to output the fail data from the second data latch in response to a second output command requesting an output of the fail data.

17 Claims, 9 Drawing Sheets

SEMICONDUCTOR MEMORY DEVICE

CROSS-REFERENCE TO RELATED APPLICATION

This application is based upon and claims the benefit of priority from Japanese Patent Application No. 2017-164770, filed Aug. 29, 2017, the entire contents of which are incorporated herein by reference.

FIELD

Embodiments described herein relate generally to a semiconductor memory device.

BACKGROUND

Static random access memory (SRAM) and dynamic RAM (DRAM) are volatile memory devices that allow high-speed access and have relatively small capacities. NAND electrically erasable and programmable read only memory (EEPROM) or hard disk drives (HDDs) are non-volatile memory or storage that have relatively large capacities, but access speeds are slow. Access speeds of NAND EEPROMs or HDDs are slower by about 1000 times of SRAMs or DRAMs.

Accordingly, development of nonvolatile memory that operates at access speeds of speeds between those SRAMs/DRAMs and NAND EEPROMs/HDDs is under way and are called storage class memory (SCM) in this specification.

For SCMs, executing writing attempts for a predetermined number of times even though the data writing fails is considered a desirable function. In this case, however, once the number of write failures exceeds a predetermined number of times, a write fault occurs, and thus recorded data maybe reset and/or lost and, CPUs or memory controllers may not appropriately track write data and the addresses of write destinations of the write data.

DETAILED DESCRIPTION

Embodiments provide a semiconductor memory device capable of outputting write data and a write address without loss to the outside or storing the write data and the write address therein even when a write fault has been determined.

In general, according to one embodiment, a semiconductor memory device, comprises a memory cell array, a first data latch that retains a write unit of data to be written to the memory cell array, a first address latch that retains a write address indicating a write target destination for the write unit of data in the first data latch, a second data latch that retains fail data that is a write unit of data that has failed to be written to the memory cell array, and a second address latch that retains a fail address indicating a write target destination for the fail data, A controller is configured to output the fail address from the second address latch in response to a first output command that requests output of the fail address and to output the fail data from the second data latch in response to a second output command requesting an output of the fail data.

Hereinafter, example embodiments of the present disclosure will be described with reference to the drawings. The examples embodiments are limits on the disclosure.

The embodiments may be applied to nonvolatile semiconductor memory devices that have latch circuits capable of retaining addresses and data of a plurality of pages between memory cell arrays and peripheral circuits. For example, the embodiments may be applied to semiconductor memory devices such as resistive RAMs (ReRAMs), magnetoresistive RAMs (MRAMs), phase change memory (PCM). Hereinafter, example embodiments applied to a ReRAM will be described.

First Embodiment

Figure 1:
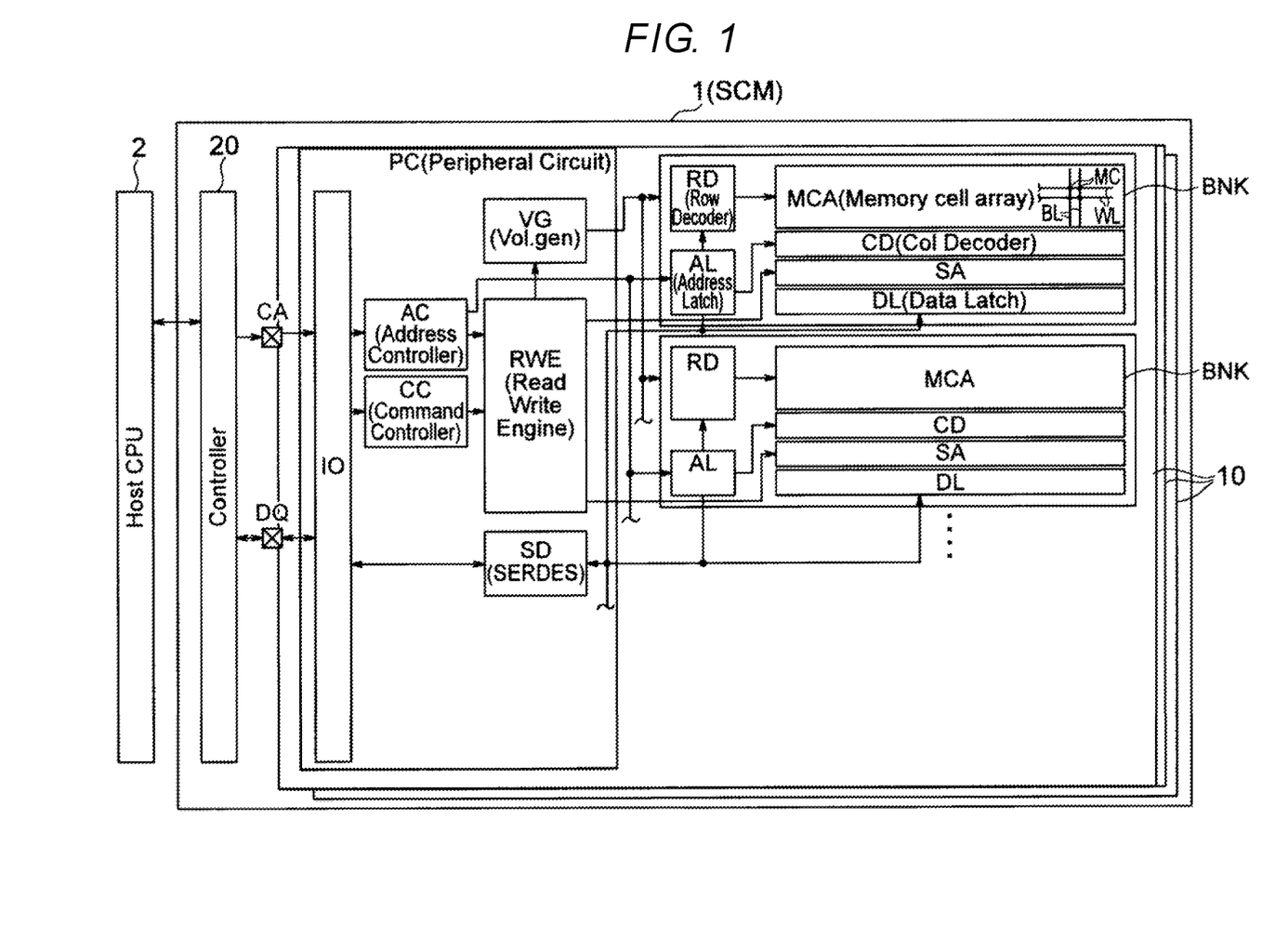
FIG. 1 is a block diagram illustrating an SCM in which a ReRAM is used according to a first embodiment.

FIG. 1 is a block diagram illustrating a storage class memory (SCM) 1 in which a ReRAM is used according to a first embodiment. The SCM 1 may be, for example, a modularized device such as a dual inline memory module (DIMM).

In the first embodiment, the SCM 1 includes a plurality of stacked memory chips 10 and a memory controller 20 and is configured as one packaged component. The memory chips 10 are stacked on each other and the number of stacked memory chips is not particularly limited. The memory controller 20 outputs commands and addresses to the plurality of memory chips 10 in response to an instruction from a host CPU 2 and reads data stored in a memory cell with a desired address or writes data on a memory cell of the desired address in response to the command. In general, data is written to and read from the memory cells in units of a page including several memory cells. In general, the host CPU 2 is external to the SCM 1 and the memory controller 20 operates based on an instruction received from the host CPU 2. A page is the unit of data corresponding to the number of memory cells that can be simultaneously read or written in a data reading operation or a data writing operation. That is, one page is the minimum reading unit or writing unit according to data operations with the SCM 1. Alternatively, the size of the page unit can be considered a structural aspect of the memory cell array corresponding to the smallest number of memory cells that can be written or read within the array of memory cells. For example, one page may be 64-bit of data or the plurality of memory cells that would store the 64-bit data.

The memory chip 10 includes a memory cell array MCA, a column decoder CD, a row decoder RD, a sense amplifier SA, a data latch DL, an address latch AL, and a peripheral circuit PC. The memory chips 10 are integrated semiconductor chips. The peripheral circuit PC of each memory chip 10 includes a voltage generator VG, a read/write engine RWE, a serializer/deserializer SD, an address controller AC, a command controller CC, and an input-output circuit IO.

The memory cell array MCA of each memory chip 10 includes, for example, a plurality of memory cells MC disposed 2-dimensionally or 3-dimensionally in a matrix form. The memory cell MC is, for example, a ReRAM. The memory cell MC is disposed, for example, at an intersection of a bit line BL and a word line WL. The memory cell array MCA may be a so-called crosspoint memory cell array or a memory cell array that has a 3-dimensional structure. The bit line BL and the word line WL are orthogonal to each other. The memory cell array MCA is divided into a plurality of banks BNK within each chip. For each bank BNK, a sense amplifier SA, a data latch DL, an address latch AL, and the like are installed.

For example, the sense amplifier SA is connected to a memory cell MC via the bit line BL and has a function of reading data of the memory cell MC.

The data latch DL temporarily retains data of a page read by the sense amplifier SA or temporarily retains data to be written to a page of the memory cell array MCA.

The address latch AL temporarily retains a page address or the like for the bank BNK which is a read or write target.

The row decoder RD and the column decoder CD access the memory cell array MCA based on an address retained in the address latch AL and then read data at the address using the sense amplifier SA and stores the read data in the data latch DL. Alternatively, the row decoder RD and the column decoder CD may access the memory cell array MCA based on an address retained in the address latch AL and then write data retained in the data latch DL to the memory cell array MCA.

The voltage generator VG generates a voltage for the word line WL or a voltage for the bit line BL as necessary for the data reading operation and the data writing operation.

The address controller AC receives a row address and a column address, decodes the received addresses, and transmits the decoded addresses to the address latch AL or the read/write engine RWE. In the case of a 3-dimensionally disposed memory cell array, a row address, a column address, and a layer address are transmitted to the address latch AL or the read/write engine RWE.

The command controller CC receives commands indicating various operations such as a data reading operation and a data writing operation and controls the read/write engine RWE according to these commands.

The read/write engine RWE controls the column decoder CD and the row decoder RD such that data received from the input-output circuit IO is written on a desired page in the bank BNK according to the command or the address or reads data from a desired page in a desired bank BNK and transmits the data to a DQ buffer of the input-output circuit IO via a serializer/deserializer SERDES. The read/write engine RWE can output an address retained in the address latch AL to the input-output circuit IO and can output data retained in the data latch DL to the input-output circuit IO.

The input-output circuit IO receives a command and an address from a Command-Address terminal CA, then transmits the command to the command controller CC and the address to the address controller AC. The command may be a write command instructing a write operation or may be a read command instructing a read operation. In the present embodiment, the command also includes a fail address output command FA for commanding the outputting of a fail address from the address latch AL and a fail data output command FD for commanding the outputting of fail data from the data latch DL. In general, the received address may be a page address indicating a read or write target page within the bank BNK. The address can also include a bank address for indicating one particular bank BNK of the memory cell array MCA in some cases. Alternatively, in some case a plurality of banks BNK may be configured into a bank group, the address can also include an address of a particular bank group in some cases. The bank address or the bank group address is temporarily retained in the read/write engine RWE and is used to select a bank BNK or a bank group that is to be activated according to a received command.

The input-output circuit IO receives write data from the DQ terminal and transmits the write data to the data latch DL via the serializer/deserializer SERDES. Alternatively, the input-output circuit IO receives the read data retained in the data latch DL via the serializer/deserializer SERDES and then outputs this read data at the DQ terminal.

The serializer/deserializer SERDES converts write data and read data from a serial transmission scheme to a parallel transmission scheme and vice versa.

The voltage generator VG, the address controller AC, the command controller CC, the read/write engine RWE, the input-output circuit IO, and the serializer/deserializer SD are installed as the peripheral circuit PC in the memory chip 10.

A single memory controller 20 is installed for the entire plurality of stacked memory chips 10 and serves to control all the memory chips 10 in the plurality.

The host CPU 2 is typically external to the packaged SCM 1.

Figure 2:
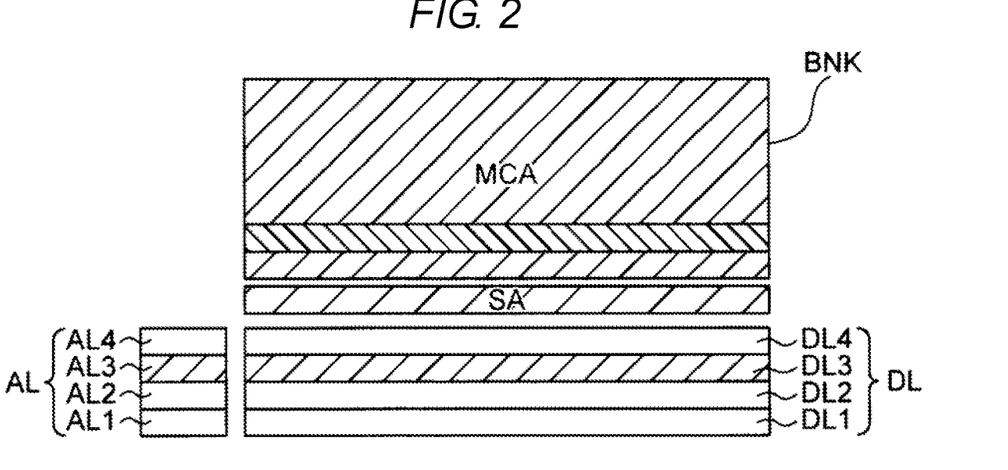
FIG. 2 is a block diagram illustrating a configuration example of a sense amplifier, a data latch, and an address latch corresponding to one bank BNK.

FIG. 2 is a block diagram illustrating a configuration example of the sense amplifier SA, a data latch DL, and an address latch AL corresponding to one bank BNK. The SCM 1 is typically required to have a relatively small data size per page and provide high-speed access. Therefore, the memory cell array MCA is divided into minimum access units corresponding to the banks BNK and each bank BNK can be made accessible/addressable. In each bank BNK, a sense amplifier SA capable of simultaneously detecting data equivalent to one page (for example, 64 bits) is installed. In each sense amplifier SA (that is, for each bank BNK), the address latch AL and the data latch DL are installed. The address latch AL includes address latch circuits AL1, AL2, AL3, AL4 and the data latch DL includes data latch circuits DL1, DL2, DL3, DL4. The individual address latch circuits (AL1 to AL4) respectively correspond to the individual data latch circuits (DL1 to DL4), and the number of address latch circuits is equal to the number of data latch circuits. As depicted in FIG. 2, for each sense amplifier SA (that is, in each bank BNK), four address latch circuits AL1 to AL4 and four data latch circuits DL1 to DL4 are installed The data latch circuits DL1 to DL4 can individually temporarily retain data equivalent to one page and can collectively store data equivalent to a total of 4 pages (for example, 64×4 bits). The address latch circuits AL1 to AL4 retain the corresponding addresses of the read sources or write destinations for the data stored in the data latch circuits DL1 to DL4.

For example, one of the data latch circuits DL1 to DL3 may retain either write data or "fail data" (that is, write data that failed to be written to the memory cell array MCA). The write data and the fail data can be retained in an empty data latch circuit among the data latch circuits DL1 to DL3. Here, the data latch circuit DL4 is a "read-data-dedicated data latch circuit" that is used exclusively to retain data read from the memory cell array MCA.

For example, when the data latch circuit DL1 retains data equivalent to one page that is to be written on the memory cell array MCA, the data latch circuit DL1 functions as a first data latch unit that retains write unit data. At this time, the address latch circuit AL1, corresponding to the data latch circuit DL1, retains a write address (for example, a page address) indicating a write destination for the write unit data held in the data latch circuit DL1. When the data latch circuit DL2/DL3 retains the write unit data, the data latch circuit DL2/DL3 functions as the first data latch unit. In this instance, the address latch circuit AL2/AL3 corresponding to the data latch circuit DL2/DL3 functions as the first address latch unit to retain the write address.

On the other hand, when data latch circuit DL1 retains write unit data that has failed to be written to the memory cell array MCA (that is, data latch circuit DL1 holds "fail data"), the data latch circuit DL1 functions as a second data latch unit and retains fail data. At this time, the address latch circuit AL1 corresponding to the data latch circuit DL1 will retain a fail address (for example, a bank address and a page address) indicating the intended write destination of what is now the fail data. Similarly, when the data latch circuit DL2 (or DL3) retains the fail data, the data latch circuit DL2 (or DL3) functions as the second data latch unit to retain the fail data. The address latch circuit AL2 (or AL3) corresponding to the data latch circuit DL2 (or DL3) then functions as the second address latch unit to retains the fail address.

The data latch circuit DL4 serving as a third data latch unit retains read data equivalent to one page that has been read from the memory cell array MCA. The address latch circuit AL4 retains a read address indicating a storage location (that is, a source address) of the read unit data. The data latch circuit DL4 is used only for storing read data.

The data latch circuit DL4 is used only for read data, but the data latch circuits DL1 to DL3 are generally used for the write data and the fail data. Accordingly, the write data and the fail data maybe retained in any empty data latch circuit among the data latch circuits DL1 to DL3.

The write data stored in the data latch circuits DL1 to DL3 is reservation data to be written on the memory cell array MCA at a subsequent write cycle in some cases. The reservation data is retained in an empty data latch circuit among the data latch circuits DL1 to DL3. The reservation data is write data to be written to the memory cell array MCA in a subsequent operational cycle, but that has not yet been written to the memory cell array MCA. The reservation data is retained as needed and then is subsequently written to the memory cell array MCA when an execution command is received. One of the address latches AL1 to AL3 corresponding to the data latch unit retains a reservation address indicating a write destination of the reservation data.

In some instances, write data equivalent to one page, fail data equivalent to one page, and reservation data equivalent to one page are stored among the data latch circuits DL1 to DL3. The address latch circuits AL1 to AL3 thus store addresses corresponding to data stored in the data latch circuits DL1 to DL3, respectively.

Next, an operation by the SCM 1 according to the first embodiment will be described.

Figure 3:
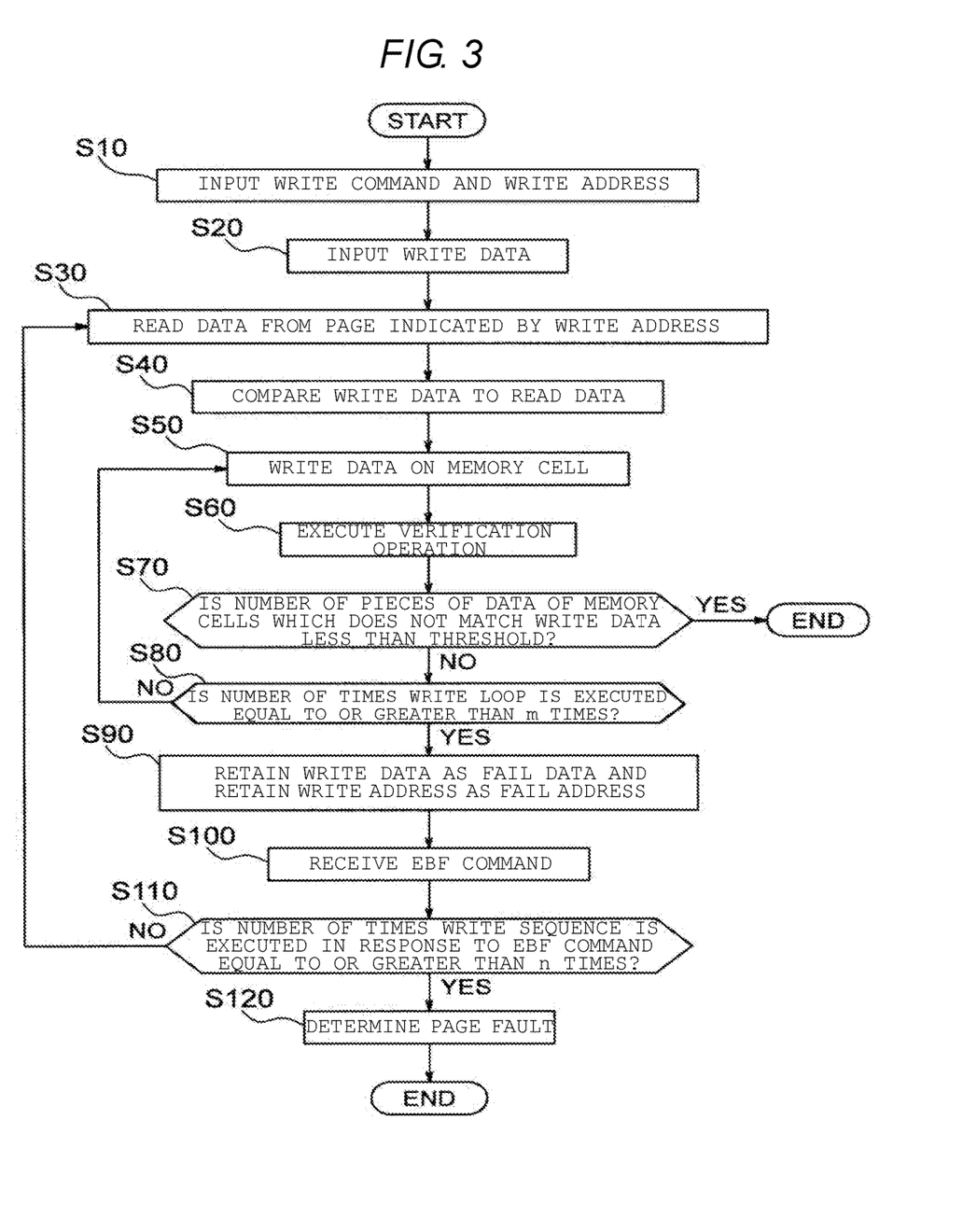
FIG. 3 is a flowchart illustrating a data writing operation by the SCM according to the first embodiment.

FIG. 3 is a flowchart illustrating a data writing operation by the SCM 1 according to the first embodiment. The address controller AC, the command controller CC, and/or the read/write engine RWE serve as a controller of the data writing operation.

In the data writing operation, the input-output circuit IO first receives the write command and the write address corresponding to the write command from controller 20 (S10). The address controller AC transmits the address to an empty address latch circuit among the address latch circuits AL1 to AL3. For example, here the address is retained in the address latch circuit AL1.

Subsequently, the write data is received via the DQ terminal (S20). The input-output circuit IO transmits the write data to the data latch DL via the serializer/deserializer SD. The write data is retained in the data latch circuit corresponding to the address latch circuit in which the received address was stored. For example, when the address is retained in the address latch circuit AL1, the write data is retained in the data latch circuit DL1.

Subsequently, the sense amplifier SA reads data from a page indicated by a write target address (S30). The read data is temporarily retained in the data latch circuit DL4.

Subsequently, the read/write engine RWE compares the write data retained in the data latch circuit DL1 to the read data retained in the data latch circuit DL4 (S40). Thus, a memory cell (bit) in the write target page that is different from that of the retained write data is determined.

Subsequently, the read/write engine RWE writes only the data in the target page that is different from that of the retained write data (S50). The read/write engine RWE does not execute the write operations on the memory cells which already have the same data state as that of the write data. At this time, the read/write engine RWE writes a SET state (low resistive state) and then subsequently writes a RESET state (high resistive state). Alternatively, the read/write engine RWE may write the RESET state (high resistive state) and then subsequently write the SET state (low resistive state).

Writing is executed by generating a voltage difference between the word line WL and the bit line BL and applying a write voltage to the memory cell MC. A magnitude relationship between a voltage of the word line WL and a voltage of the bit line BL is reversed between writing in the SET state and writing in the RESET state.

Subsequently, a verification operation is executed (S60). In the verification operation, the read/write engine RWE reads data at the write target page and compares the just read data to the original write data. When the number of memory cells (that is, the number of bits) which does not match with a logic of the write data in the page is less than a threshold (YES in S70), the writing of the page is considered to have been successful(passes). When the writing succeeds, the write operation on the page ends.

One write loop includes the write operation of applying a write voltage to the memory cell MC and the verification operation for verifying whether data is successfully written to the memory cell MC. The write loop is, for example, an operation including steps S50 to S70. In a write sequence, the write loop is repeated as needed to write data to the memory cells in the page. One write sequence can include m (where m is an integer equal to or greater than 2) write loops. The upper value for m is not particularly limited and is, for example, 4 in this case. When data is not successfully written despite the write loop executed a total of four times, the address and the data are retained as a fail address in one of address latch circuit AL1 to AL3 and fail data in one of data latch circuits DL1 to DL3).

For example, when the number of pieces of data of the memory cells which does not match with the logic of the write data in the page is equal to or greater than the threshold (NO in S70), steps S50 to S70 are executed again. The write loop of steps S50 to S70 is repeated up to a total of m times if the verification operation does not pass in step S70 (NO in S80). When the verification operation does not pass despite the write loop being repeated for the limit of m times (YES in S80), the write data is retained as fail data in the data latch circuit DL2, for example. Along with the write data, the write address will be retained as a fail address in the corresponding address latch circuit AL2 (S90).

Subsequently, when an extension buffer flush (EBF) command is received (S100), the read/write engine RWE attempts to rewrite any fail data that is stored in the data latch circuit DL2 on a corresponding page in the memory cell array MCA according to the fail address stored in the address latch circuit AL2. The write sequence for the rewriting is substantially the same as the write sequence of steps S30 to S90. At this time, the write loop counter is executed is reset to 0. Accordingly, the write loop will be repeated up to m total times or until the verification operation passes, whichever occurs first.

When the verification operation passes for a write loop, the write operation on the page ends. When the verification operation does not pass despite the write loop being executed m total times after the EBF command (YES in S80), the write data is stored still as the fail data in the data latch circuit DL2 and the write address is still stored as the fail address in the address latch circuit AL2 (S90).

The write sequence in response to the EBF command is repeated n times (where n is an integer equal to or greater than 2). If the verification operation passes for one write sequence, the write operation on the page ends. Conversely, when the verification operation on the page does not pass despite the fact that the write sequence is repeated in response to the EBF command for a total of n times (YES in S110), the targeted page of the memory cell array MCA is determined to be a faulty page (S120).

Here, handling of the fail address and the fail data when the page is determined to be the faulty page will be described.

Figure 4:
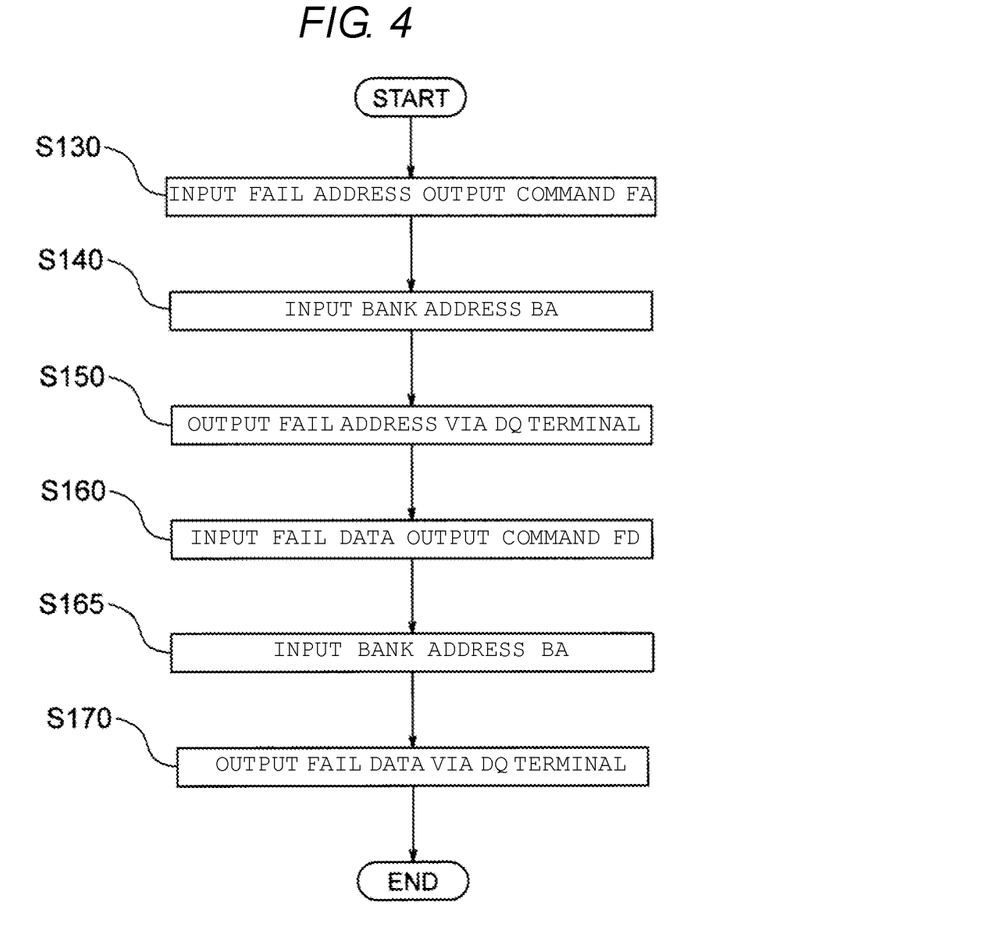
FIG. 4 is a flowchart illustrating handling of a fail address and fail data.
Figure 5:
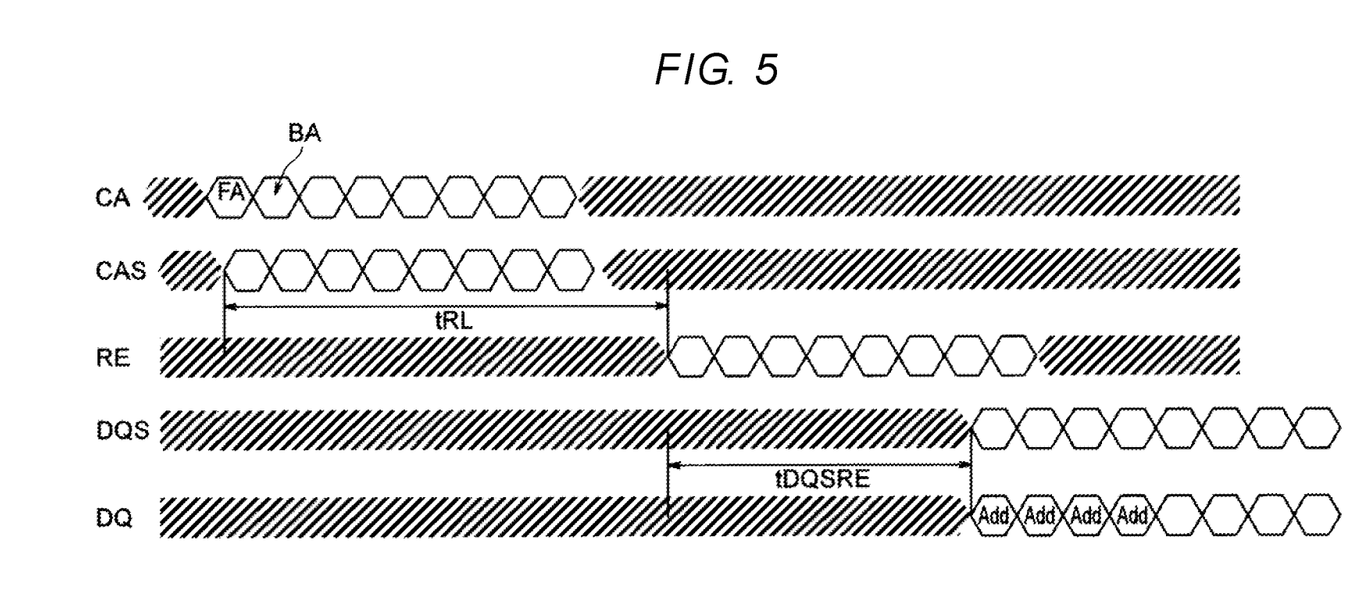
FIG. 5 is a timing diagram illustrating handling of the fail address and the fail data.
Figure 6:
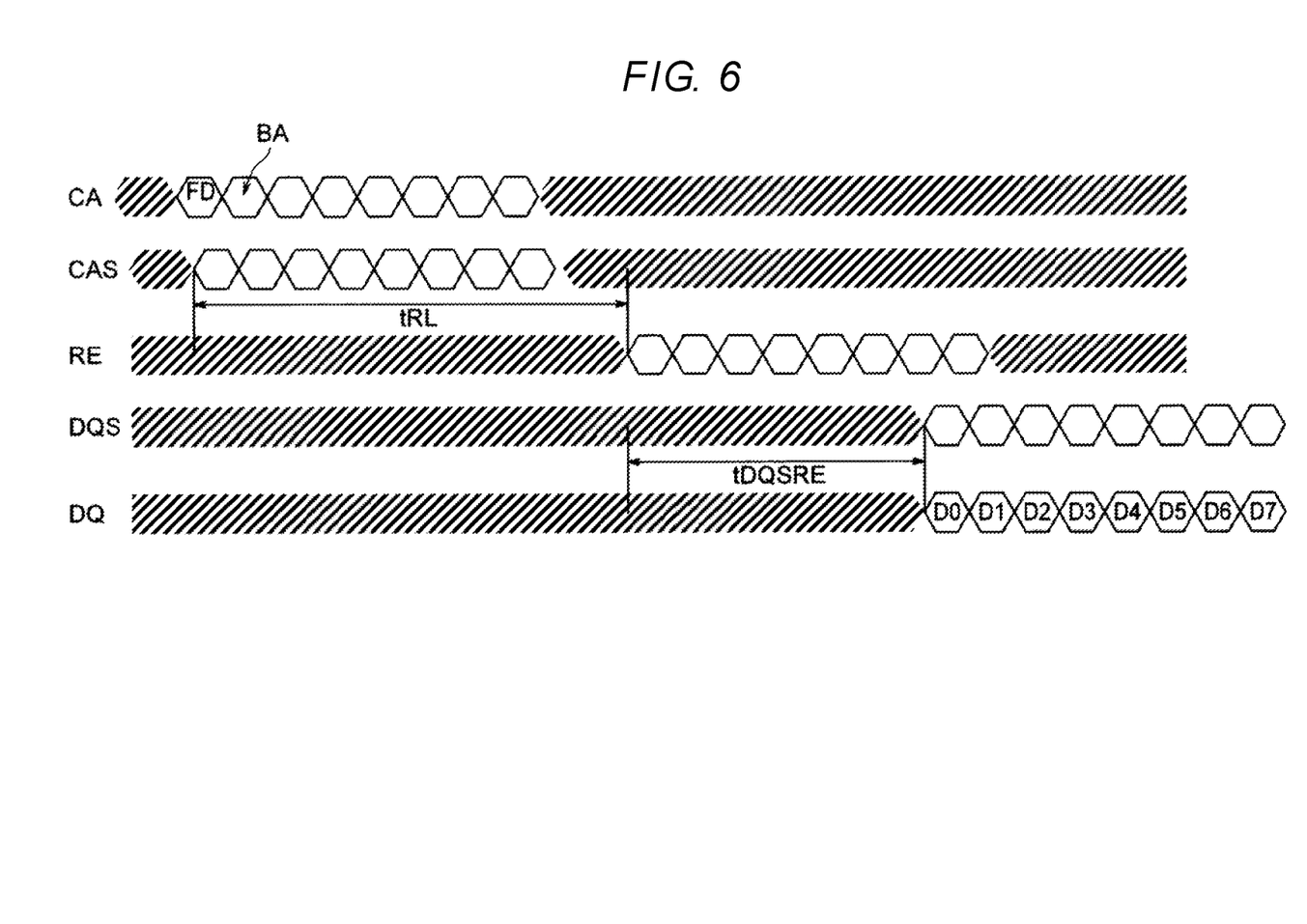
FIG. 6 is a timing diagram illustrating the handling of the fail address and the fail data.

FIG. 4 is a flowchart illustrating handling of the fail address and the fail data. FIGS. 5 and 6 are timing diagrams illustrating aspects of the handling of the fail address and the fail data. In FIGS. 5 and 6, a signal CA indicates a command and an address that is input to the SCM 1. The label "FA" in the signal CA denotes that a fail address output command FA is being provided, the label "BA" in the signal CA denotes a bank address a page address can also be provided. A signal CAS indicates a clock signal that represents a timing at which the signal CA is input to the SCM 1. A signal RE indicates a clock signal that represents a timing at which data is read from the DQ terminal to the outside. The signal RE is input after the signal CAS is input and a delay time tRL elapses. A signal DQS indicates a clock signal that represents a timing at which the data DQ is output from the SCM 1 to the outside of the memory chip 10. The signal DQS is generated after the signal RE is input and a delay time tDQSRE elapses after the input of the signal RE. The controller takes data output at the timing of the signal DQS. The signal DQ is data output from the DQ terminal.

After the page is determined to be the faulty page in step S120 of FIG. 3, the SCM 1 receives the fail address output command FA as a first output command indicting an instruction to output the fail address according to the signal CAS (S130). The fail address output command FA is a new command type which is generally not present in standard command sets until now for use with the SCM 1 and is a command for outputting the fail address from the address latch circuit AL2 to the outside of the memory chip 10. Subsequently to the fail address output command FA, the SCM 1 receives the bank address BA according to the signal CAS (S140). When the bank BNK is specified with the bank address BA, the address of the faulty page retained in the address latch of the addressed bank BNK is output. More specifically, a flag/indicator is set for the address latch in which the faulty address is stored among the address latches AL1 to AL3. The data in the flagged address latch information is output to the DQ. The bank address BA may be the address of a bank group in which a plurality of banks is collected as one group.

After the delay time tRL elapses, the signal RE is input. Thereafter, after the delay time tDQSRE elapses, the fail address is output from the address latch circuit AL2 via the DQ terminal according to the signal DQS (S150). That is, the read/write engine RWE serving as the controller outputs the fail address from the address latch circuit AL2 according to the input of the fail address output command FA. In the signal CA in FIG. 5, a signal input after the bank address BA may be absent. The fail address output from the signal DQ is, for example, four pieces of 8-bit data and data subsequent to the fail address may be absent.

Subsequently, as illustrated in FIG. 6, the SCM 1 receives the fail data output command FD as a second output command indicating an instruction to output fail data according to the signal CAS (S160). Subsequently to the fail data output command FD, the SCM 1 receives the bank address BA and possibly the page address according to the signal CAS (S165). The fail data output command FD is a new command type which is not present in standard command sets until now for use with the SCM 1 and is a command for outputting the fail data from the data latch circuit DL2 to the outside of the memory chip 10. When the bank BNK is specified with the bank address BA, the address of the faulty page retained in the address latch of the addressed bank BNK is output. More specifically, a flag/indicator is set for the address latch in which the faulty address is stored among the address latches AL1 to AL3. The data in the flagged address latch is output to the terminal DQ (in the signal DQ). The bank address BA may be the address of a bank group in which a plurality of banks is set as one group.

After the delay time tRL elapses, the signal RE is input. Thereafter, after the delay time tDQSRE elapses, the fail data is output from the data latch circuit DL2 via the DQ terminal according to the signal DQS (S170). That is, the read/write engine RWE outputs the fail data from the data latch circuit DL2 according to the receipt of the fail data output command FD. In the signal CA in FIG. 6, a signal input after the bank address BA may be absent. The data output in the signal DQ is, for example, eight pieces of 8-bit data.

The fail address and the fail data output from the memory chip 10 may be stored in the memory controller 20 or may be output from the SCM 1 to be stored in the host CPU 2.

In this way, the SCM 1 according to the present embodiment outputs the fail address of the faulty page for which a write fault has been determined during the data writing operation from the address latch circuit AL2 according to the fail address output command FA. The SCM 1 outputs the fail data of the faulty page from the data latch circuit DL2 from the data latch circuit DL2 according to the fail data output command FD. Thus, in the data writing operation, the fail address and the fail data of the faulty page can be output to the outside of the SCM 1. Thus, the memory controller 20 or the host CPU 2 can store the fail address and the fail data.

When the fail address output command FA and the fail data output command FD are not sent, the fail address and the fail data would ultimately be reset and erased in the address latch circuit AL2 and the data latch circuit DL1 without being output to the outside of the SCM 1. In such a case, since neither the memory controller 20 nor the host CPU 2 stores the fail address and the fail data, the fail address and the fail data become unknown or lost.

However, since the SCM 1 according to the present embodiment outputs the fail address and the fail data the fail address and the fail data can be stored. As a result, it is easy to specify the fail address and the fail data without losing the fail data and the fail address. By storing the fail address, the memory controller 20 or the host CPU 2 can know which pages are faulty in each bank BNK of the memory cell array MCA. The memory controller 20 or the host CPU 2 can thus impose an access restriction on the fail address, and thus unnecessary access operations can be precluded.

A user may still be allowed to refer to the fail address and the fail data via the host CPU 2. However, the fail data may be rewritten to another page of the memory cell array MCA using a rewrite address different from the fail address. When the fail data is written to another page, the read/write engine RWE inputs a rewrite command REPRO and a rewrite address indicating rewriting of the fail data and writes the fail data at the rewrite address of the memory cell array MCA according to the rewrite command REPRO.

Thus, even when a certain page of the memory cell array MCA is broken, the data can be stored in another page.

Second Embodiment

In the first embodiment, the SCM 1 outputs the fail address and the fail data to the outside of the SCM 1. On the other hand, the SCM 1 according to a second embodiment simply writes the fail data to another address of the memory cell array according to the rewrite command REPRO without outputting the fail address and the fail data to the outside.

Figure 7:
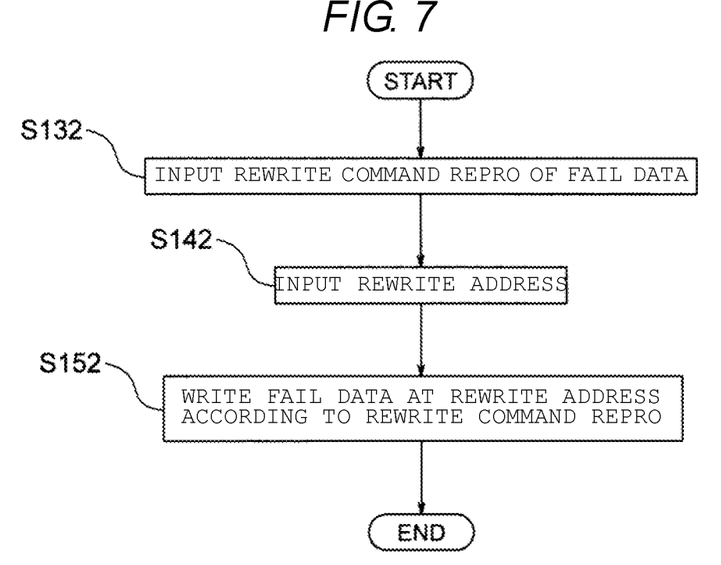
FIG. 7 is a flowchart illustrating an operation by an SCM according to a second embodiment.
Figure 8:
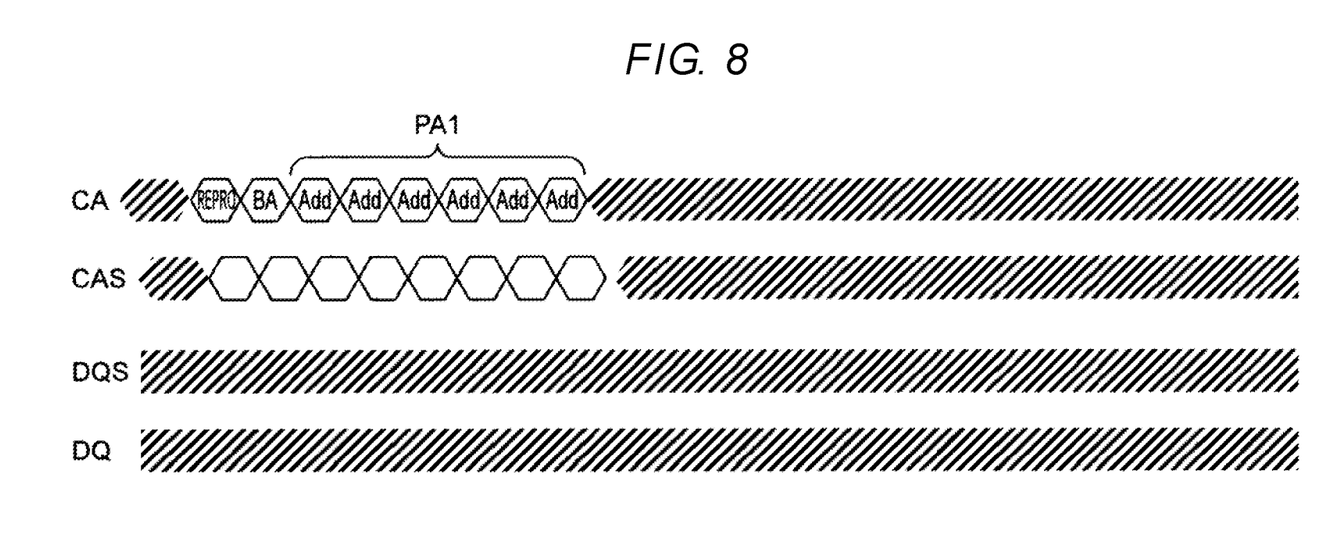
FIG. 8 is a timing diagram illustrating an operation by the SCM according to the second embodiment.

FIG. 7 is a flowchart illustrating an operation by the SCM 1 according to the second embodiment. FIG. 8 is a timing diagram illustrating an operation by the SCM 1 according to the second embodiment.

When a write target page is determined to be faulty after execution of steps S10 to S120 of FIG. 3, the fail address and the fail data are retained in for example, the address latch circuit AL2 and the data latch circuit DL2.

Subsequently, as illustrated in FIG. 8, the SCM 1 receives the rewrite command REPRO indicating rewriting of the fail data according to the signal CAS (S132). The rewrite command REPRO is a new command type which is not present in standard command sets until now for use with the SCM 1 and is a command for giving an instruction to rewrite the fail data on the memory cell array MCA from the address latch circuit AL2. Subsequently to the rewrite command REPRO, the SCM 1 receives the bank address BA and a page address PA1 according to the signal CAS (S142). The page address PA1 serves as a rewrite address and is the address of another page within the same bank as the fail address. The bank address BA may be the address of a bank group in which a plurality of banks is treated as one group.

Here, in the second embodiment, the fail data is still retained in the data latch circuit DL2. Accordingly, the read/write engine RWE may write the fail data in the data latch circuit DL2 to the page address PA1 that different from the failed page address (i.e., initial targeted address) according to the rewrite command REPRO when the rewrite command REPRO and the page address PA1 serving as the rewrite address are received (S152). That is, the SCM 1 need not export the fail data to the outside.

In this way, the SCM 1 according to the second embodiment writes the fail data retained in the internal data latch circuit DL2 to a page with another address when the rewrite command REPRO is received. Thus, the SCM 1 according to the second embodiment can store the fail data on another page without losing the fail data. The fail data need not be re-input from the outside. Thus, the memory controller 20 or the host CPU 2 do not need to retain the fail data.

Third Embodiment

Figure 9:
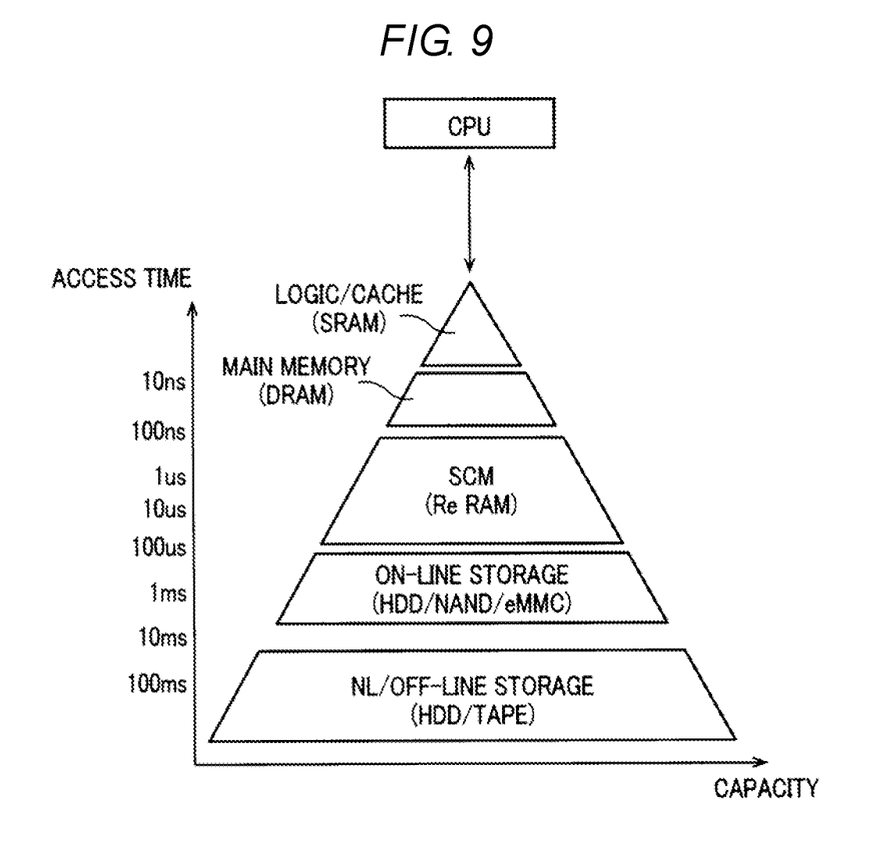
FIG. 9 is a diagram illustrating an example of an overview of a memory system or a storage system including various devices as constituent elements according to a third embodiment.

FIG. 9 is a diagram illustrating an overview of a memory system or a storage system including various devices as constituent elements according to a third embodiment.

In FIG. 9, the vertical axis represents a nominal access time for each device type. Such numerical values are estimates and can be variable. However, the access time of a higher-ranking device is generally shorter than an access time of a lower-ranking device. The horizontal axis represents a notional memory (data storage) capacity. The length of the bottom edge of each region along the horizontal access corresponds to a memory capacity of the device type. That is, a longer bottom edge for a device type indicates a memory capacity for that device type is larger.

An SRAM type memory unit, which is the highest-ranking device of the memory systems and the storage systems in FIG. 9, is connected to a CPU via a first interface. Alternatively, the SRAM unit contains or is directly integrated with a CPU.

A DRAM type memory unit, which is located at a lower ranking than the SRAM in FIG. 9, is connected to the CPU or the SRAM via the CPU and the first interface. The DRAM may be connected to the CPU or the SRAM via a second interface different from the first interface. Alternatively, the DRAM may contain a CPU.

An SCM (storage class memory), which is a device located at a lower ranking than the DRAM in FIG. 9, is connected to the CPU or the DRAM via the CPU and the first or second interface. The SCM may be connected to the CPU or the DRAM via a third interface different from the first and second interfaces. Alternatively, the SCM may contain a CPU.

In some systems one or more of the SRAM, the DRAM, and the SCM may not be included.

A HDD/NAND/eMMC (hard disk drive/NAND array device/embedded multimedia card) or the like, which is a lower ranking device than the SCM may be configured to be integrated with the memory system or the storage system. As illustrated, for example, the HDD/NAND/eMMC may be configured as a network linked (NL) storage device physically separated from the memory system or the storage system.

An HDD/tape type device, which is a lowest-ranking device, maybe configured to be integrated as the memory system or the storage system. For example, the HDD/tape may be configured as an off-line storage to be physically separated from the memory system or the storage system.

Here, the SCM may be the SCM 1 according to the first or second embodiment. The CPU may be the host CPU 2 in FIG. 1.

The memory controller 20 in FIG. 1 is the memory controller of a SCM. For example, the memory controller 20 may also serve as a memory controller of DRAM which is a higher-ranking device in FIG. 9. The memory controller 20 may also serve as a memory controller of the NAND/eMMC/HDD/Tape which is the lower ranking device.

The semiconductor memory device according to an embodiment may further include: a third data latch unit that retains read unit data read from a memory cell array; a third address latch unit that retains a read address at which a storage destination of the read unit data is indicated; a fourth data latch unit that retains write unit data to be written on the memory cell array at a subsequent write cycle as reservation data; and a fourth address latch unit that retains a reservation address indicating a write destination of the reservation data.

The controller may input a rewrite command (REPRO) indicating rewriting of fail data and a rewrite address different from the fail address and may write the fail data of the second data latch unit at a rewrite address of the memory cell array in response to a rewrite command.

The memory cell array, the first and second data latch units, the first and second address latch units, and the controller may be integrated in one semiconductor chip.

The write sequence in which the write unit data is written on the memory cell array may include a write loop of m (where m is an integer equal to or greater than 2) times including a write operation of applying a write voltage and a verification operation of verifying whether data is written on the memory cell array. When the write unit data is not written in the write sequence, the write sequence may be executed again. When the number of times the write sequence is repeated reaches n (where n is an integer equal to or greater than 2), a first output command may be input.

The write sequence in which the write unit data is written on the memory cell array may include a write loop of m (where m is an integer equal to or greater than 2) times including a write operation of applying a write voltage and a verification operation of verifying whether data is written on the memory cell array. When the write unit data is not written in the write sequence, the write sequence may be executed again. When the number of times the write sequence is repeated reaches n (where n is an integer equal to or greater than 2), the rewrite command and the rewrite address may be input. The memory system according to the embodiment may be a memory system including a CPU, a volatile memory connected to the CPU, the semiconductor memory device which is connected to the CPU or the volatile memory and in which an access time is longer than the volatile memory, and a storage which is connected to the CPU, the volatile memory, or the semiconductor storage device and in which an access time is longer than the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array;
a first data latch that retains a write unit of data to be written to the memory cell array;
a first address latch that retains a write address indicating a write target destination for the write unit of data in the first data latch;
a second data latch that retains fail data that is a write unit of data that has failed to be written to the memory cell array;
a second address latch that retains a fail address indicating a write target destination for the fail data; and
a controller configured to output the fail address from the second address latch in response to a first output command requesting output of the fail address and to output the fail data from the second data latch in response to a second output command requesting an output of the fail data, wherein the first output command is a fail address output command supplied by a host device.

2. The semiconductor memory device according to claim 1, wherein the controller is further configured to write the fail data from the second data latch to a rewrite address in the memory cell array different from the fail address when a rewrite command with the rewrite address is received.

3. The semiconductor memory device according to claim 2, wherein
a write sequence in which the write unit of data is written to the memory cell array includes a write loop including a write operation of applying a write voltage to write the data to the memory cells and a verification operation of verifying whether the data has been written to the memory cell array, and
when the write unit of data is not successfully written in the write sequence, the controller is configured to repeat the write sequence for up to a predetermined maximum number of times, and if the predetermined maximum number of times is reached without successfully writing the write unit of data to the memory cell array, the controller is configured to write the fail data from the second data latch to a rewrite address in the memory cell array, the rewrite address being different from the fail address.

4. The semiconductor memory device according to claim 1, wherein the memory cell array is a resistance-change type memory.

5. The semiconductor memory device according to claim 1, wherein the memory cell array comprises resistive random access memory (ReRAM) cells.

6. The semiconductor memory device according to claim 1, wherein the memory cell array is a portion of storage class memory (SCM) device.

7. The semiconductor memory device according to claim 1, wherein the write unit corresponds to a page of the memory cell array.

8. The semiconductor memory device according to claim 1, wherein the write unit is 64 bits of data.

9. The semiconductor memory device according to claim 1, wherein
a write sequence in which the write unit of data is written to the memory cell array includes a write loop including a write operation of applying a write voltage to write the data to the memory cells and a verification operation of verifying whether the data has been written to the memory cell array, and
when the write unit of data is not successfully written in the write sequence, the controller is configured to repeat the write sequence for up to a predetermined maximum number of times, and if the predetermined maximum number of times is reached without successfully writing the write unit of data to the memory cell array, the controller outputs the fail address from the second address latch and outputs the fail data from the second data latch.

10. A memory device, comprising:
a memory cell array comprising a plurality of pages;
a first data latch connected to the memory cell array and configured to retain a page of data to be written to the memory cell array;
a first address latch associated with the first data latch and configured to store a write address indicating a write target destination for the page of data retained in the first data latch;
a second data latch connected to the memory cell array and configured to retain a page unit of fail data that is data that has failed to be written to the memory cell array after repeated attempted write operations to the memory cell array;

a second address latch associated with the second data latch and configured to retain a fail address indicating a write target destination for the fail data; and a controller connected to the memory cell array and configured to output the fail address from the second address latch in response to a first output command requesting output of the fail address and to output the fail data from the second data latch in response to a second output command requesting an output of the fail data, wherein the first output command is provided from a host device.

11. The memory device according to claim 10, wherein the memory cell array is a resistance-change type memory.

12. The memory device according to claim 10, wherein the memory cell array comprises resistive random access memory (Re RAM) cells.

13. A memory device, comprising:

a memory cell array comprising a plurality of pages;

a first data latch connected to the memory cell array and configured to retain a page of data to be written to the memory cell array;

a first address latch associated with the first data latch and configured to store a write address indicating a write target destination for the page of data retained in the first data latch;

a second data latch connected to the memory cell array and configured to retain a page unit of fail data that is data that has failed to be written to the memory cell array after repeated attempted write operations to the memory cell array;

a second address latch associated with the second data latch and configured to retain a fail address indicating a write target destination for the fail data; and a controller connected to the memory cell array and configured to output the fail address from the second address latch in response to a first output command requesting output of the fail address and to output the fail data from the second data latch in response to a second output command requesting an output of the fail data, wherein the controller is configured to repeat the write operation for any page of data up to a predetermined maximum number of times, and if the predetermined maximum number of times is reached without successfully writing the page of data to the memory cell array, the controller is configured to store the page of data in the first data latch in the second data latch as the fail data and store the address in the first address latch in the second address latch as the fail address data.

14. The memory device according to claim 13, wherein the controller is further configured to write the page of data from the second data latch to a rewrite address within the memory cell array, the rewrite address being different from the fail address.

15. A method of controlling a semiconductor memory device having a memory cell array, a first data latch unit that retains write unit of data to be written to the memory cell array, a first address latch unit that retains a write address indicating a write target destination for the write unit data, a second data latch unit that retains a write unit of data that has failed to be written on the memory cell array as fail data, and a second address latch unit that retains a fail address indicating a write target destination of the fail data, the method comprising:

receiving a first output command requesting an output of the fail address;

outputting the fail address from the second address latch unit in response to the first output command;

receiving a second output command requesting an output of the fail data; and outputting the fail data from the second data latch unit in response to the second output command, wherein the first output command is a fail address output command supplied by a host device.

16. The method of claim 15, wherein the semiconductor memory device is a storage class memory device and the memory cell array comprises variable resistance random access memory cells.

17. The method of claim 15, further comprising:

receiving a rewrite command instructing a rewriting of the fail data and a rewrite address different from the fail address; and writing the fail data from the second data latch unit to the rewrite address of the memory cell array in response to the rewrite command.

* * * * *